(12) United States Patent
Geissdörfer et al.

(10) Patent No.: US 10,491,195 B2
(45) Date of Patent: Nov. 26, 2019

(54) FILTER SWITCHING METHOD FOR A MACHINE CONTROL SYSTEM

(71) Applicant: Siemens Aktiengesellschaft, München (DE)

(72) Inventors: Klaus Geissdörfer, Erlangen (DE); Carsten Hamm, Eggolsheim (DE); Theo Reichel, Forchheim (DE); Elmar Schäfers, Fürth (DE); Torsten Schür, Erlangen (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 8 days.

(21) Appl. No.: 15/751,774

(22) PCT Filed: Aug. 9, 2016

(86) PCT No.: PCT/EP2016/068944
§ 371 (c)(1),
(2) Date: Feb. 9, 2018

(87) PCT Pub. No.: WO2017/025531
PCT Pub. Date: Feb. 16, 2017

(65) Prior Publication Data
US 2018/0241376 A1    Aug. 23, 2018

(30) Foreign Application Priority Data
Aug. 11, 2015   (EP) .................................... 15180564

(51) Int. Cl.
*H03H 17/02*    (2006.01)
*G05B 19/18*    (2006.01)
*G05B 19/416*   (2006.01)

(52) U.S. Cl.
CPC ......... *H03H 17/0294* (2013.01); *G05B 19/18* (2013.01); *G05B 19/416* (2013.01);
(Continued)

(58) Field of Classification Search
CPC .................. G05B 19/19; G05B 19/404; G05B 2219/34013; G05B 2219/34027;
(Continued)

(56) References Cited

U.S. PATENT DOCUMENTS

| | | | | |
|---|---|---|---|---|
| 4,707,780 A | * | 11/1987 | Gose | ....................... G05B 19/19 |
| | | | | 318/632 |
| 5,351,205 A | * | 9/1994 | Hoos | ..................... G05B 19/416 |
| | | | | 318/568.18 |

(Continued)

FOREIGN PATENT DOCUMENTS

| | | |
|---|---|---|
| EP | 0135024 B1 | 9/1989 |
| EP | 0477412 A1 | 4/1992 |
| EP | 2418773 A1 | 2/2012 |

OTHER PUBLICATIONS

PCT International Search Report and Written Opinion of International Searching Authority dated Sep. 12, 2016 corresponding to PCT International Application No. PCT/EP2016/068944 filed Sep. 8, 2016.

(Continued)

*Primary Examiner* — Darrin D Dunn
(74) *Attorney, Agent, or Firm* — Henry M. Feiereisen LLC (57) ABSTRACT

The invention relates to a method (100) for switching between desired value filters (26, 28) of a drive means (52) for a machine axis (10, 12) during operation. An input signal (20) is applied to the first and to the second desired value filter (26, 28) for producing a first and a second output signal (23, 33). Then any deviation between the first and the second (Continued)

output signal (23, 33) is determined. If the deviation falls below a threshold value, the first desired value filter (26) is separated from the drive means (52) and substantially simultaneously the second desired value filter (28) is connected to the drive means (52). The desired value filters (26, 28) have different running times (19).

14 Claims, 5 Drawing Sheets (52) U.S. Cl.
CPC . *H03H 17/026* (2013.01); *G05B 2219/41151* (2013.01); *G05B 2219/41152* (2013.01); *G05B 2219/41231* (2013.01); *H03H 2017/0295* (2013.01)

(58) Field of Classification Search
CPC ........ G05B 2219/42152; G05B 13/024; G05B 2219/36507; G05B 2219/37297; G05B 2219/37493; G05B 2219/41119; G05B 2219/41152; G05B 2219/41166; G05B 2219/41176; G05B 2219/42114; G05B 2219/42128
See application file for complete search history.

(56) References Cited

U.S. PATENT DOCUMENTS

| | | | | |
|---|---|---|---|---|
| 6,903,529 | B2* | 6/2005 | Kunzel | F16F 15/005 318/609 |
| 6,982,536 | B2* | 1/2006 | Geissdorfer | B23K 26/0876 318/575 |
| 7,107,119 | B2 | 9/2006 | Geissdörfer et al. | |
| 7,236,913 | B2 | 6/2007 | Hamm et al. | |
| 7,299,108 | B2 | 11/2007 | Geissdörfer et al. | |
| 7,656,106 | B2* | 2/2010 | Iwashita | G05B 19/195 318/39 |
| 7,902,785 | B2 | 3/2011 | Denk et al. | |
| 2004/0150363 | A1* | 8/2004 | Toyozawa | G05B 19/404 318/568.13 |
| 2006/0173573 | A1* | 8/2006 | Hosokawa | G05B 19/404 700/193 |
| 2007/0260356 | A1* | 11/2007 | Kock | B25J 9/1641 700/261 |
| 2008/0218116 | A1* | 9/2008 | Maeda | G05B 19/19 318/571 |
| 2008/0247598 | A1* | 10/2008 | Movellan | G06K 9/00248 382/100 |
| 2010/0092262 | A1 | 4/2010 | Hamann et al. | |
| 2010/0295495 | A1* | 11/2010 | Iwashita | G05B 19/19 318/561 |
| 2011/0133681 | A1* | 6/2011 | Okita | G05B 19/19 318/561 |
| 2013/0160143 | A1 | 6/2013 | Hamm et al. | |
| 2013/0173026 | A1* | 7/2013 | Kawana | G05B 19/416 700/30 |
| 2015/0105905 | A1* | 4/2015 | Nishida | B25J 9/1641 700/254 |
| 2015/0355647 | A1 | 12/2015 | Bitterolf et al. | |
| 2016/0033954 | A1* | 2/2016 | Sonoda | G05B 19/19 318/573 |
| 2016/0056794 | A1 | 2/2016 | Geissdörfer et al. | |
| 2016/0090288 | A1* | 3/2016 | Givens, Jr. | B67D 1/0041 700/283 |
| 2017/0293287 | A1* | 10/2017 | Sonoda | G05B 19/416 |
| 2017/0371315 | A1* | 12/2017 | Watanabe | G05B 19/31 |

OTHER PUBLICATIONS

PCT International Preliminary Examination Report and Written Opinion of International Examination Authority dated Nov. 21, 2017 corresponding to PCT International Application No. PCT/EP2016/068944 filed Sep. 8, 2016.
Dort et al., U.S. Pat. No. 8,978,503, Mar. 17, 2015, 2013-0031994, Feb. 7, 2013.
Carsten Hamm, U.S. Pat. No. 8,909,371, Dec. 9, 2014, 2013-0120253, May 16, 2013.
Hamm et al., U.S. Pat. No. 9,555,546, Jan. 31, 2017, 2015/0073593, Mar. 12, 2015.
Ladra et al., U.S. Pat. No. 8,157,752, Apr. 17, 2012, 2010/0032879, Feb. 11, 2010.
Bitterolf et al., U.S. Pat. No. 8,955,789, Feb. 17, 2015, 2013-0026278, Jan. 31, 2013.
Ladra et al., U.S. Pat. No. 9,316,283, Apr. 19. 2016, 2013-0085617, Apr. 4, 2013.
Ladra et al., U.S. Pat. No. 9,740,179, Aug. 22, 2017, 2013-0085607, Apr. 4, 2013.
Ladra et al., U.S. Pat. No. 8,763,771, Jul. 1, 2014, 2013-0081914—, Apr. 4, 2013.

* cited by examiner

FILTER SWITCHING METHOD FOR A MACHINE CONTROL SYSTEM

CROSS-REFERENCES TO RELATED APPLICATIONS

This application is the U.S. National Stage of International Application No. PCT/EP2016/068944, filed Aug. 9, 2016, which designated the United States and has been published as International Publication No. WO 2017/025531 and which claims the priority of European Patent Application, Serial No. 15180564.5, filed Aug. 11, 2015 pursuant to 35 U.S.C. 119(a)-(d).

BACKGROUND OF THE INVENTION

The invention relates to a method for switching between desired value filters of a machine control system for a drive means of a machine during operation. The invention also relates to a program, to a control unit of a machine and to a machine of this kind.

From EP 0 477 412 A1 a filtering method is known for a machine control system, in which digital signals are smoothed using filters. The filters, which are to be switched between, have different filter lengths. The path difference between the path specified by the desired values and the reduced path covered owing to the filter is determined. During switching, the path deviation along the direction of movement is minimized by mathematical modification of a feedback loop to the signal input.

EP 0 135 024 B1 discloses a transmission arrangement for audio signals, which have two signal paths, with a digital transmission element being arranged in each signal path. Each transmission element has a coefficient set relating to its configuration. Provided between the signal paths is a discriminator, which is supplied with the output signals of the two transmission elements. The mathematical sign of a difference between the output signals of the two transmission elements is detected and, in the case of a change of sign, a switching, signal is given for the transmission elements.

One drawback of known options for switching between different filters is that there is a considerable risk of a step-like, in other words discontinuous, transition in the case of the desired values of the output signals with which the drives of a machine are controlled. A sufficiently smooth transition from one filter to another, as is necessary for example for precision applications, typically requires a stoppage of the respective machine axis. Furthermore, switching methods, in which there is a reduced risk of a step-like transition of output signals, require high computing power. There is a need for a filter switching method which overcomes the drawbacks from the prior art, which reliably enables smooth switching between different filters during a machine movement, and which can be implemented with low demands in terms of computing power.

SUMMARY OF THE INVENTION

The object is achieved by the inventive method. The inventive filter switching method is carried out in a machine control system during operation of a drive means, which forms part of a first machine axis. The machine control system has a first and a second desired value filter for the machine axis, between which the switch is to be made. In a first method step, an input signal, which is provided by a further component of the machine control system by way of an input unit, is applied to the first desired value filter. The input signal is processed by the desired value filter such that a first output signal is generated, which is forwarded to the drive means during operation of the machine.

In a further method step, the input signal is duplicated and simultaneously applied to the second desired value filter. The second desired value filter generates a second output signal using the input signal. In a subsequent method step, the first and second output signals are forwarded to a subtraction unit, which forms a difference between the first and second output signals. The formed difference is the deviation of the first from the second output signals, which is evaluated further in a comparator in a further method step.

If the deviation between the first and second desired value filters falls below an adjustable threshold value, a minimized discontinuity exists between the desired value filters during switching, so the first machine axis deviates only minimally from its envisaged trajectory. The threshold value defines the degree of discontinuity, which is acceptable in the present application during filter switching. If the deviation determined by the subtraction unit falls below the threshold value, the first desired value filter is separated immediately from the drive means and the second desired value filter is essentially simultaneously connected to the drive means. The immediate separation and connection of the first and second desired value filters respectively takes place at the maximum attainable actuating speed, in other words omitting and bypassing avoidable time losses.

In the inventive method the first and second desired value filters have different running times. In desired value filters that are currently typical, the running time is a measure of the attainable dynamics and movement precision when the drive means are actuated. A desired value filter having a low running time ensures a high degree of dynamics, in other words high jerks and accelerations. A desired value filter, by contrast, which is designed for high movement precision, typically has a high running time. The invention is based on the surprising recognition that the described switching method leads to unexpected, smooth switching between the desired value filters even in the case of desired value filters having different running times.

The inventive method allows drive means to switch between different operating modes for the first machine axis depending on the application requirement. Typically, an auxiliary process time, in which the machine moves with high dynamics, requires a different desired value filter than, for example, when machining a workpiece. The inventive method requires only that the two desired value filters run simultaneously in terms of the output signal. This is a condition, which can be detected quickly and easily by subtraction of the output signals. Furthermore, the inventive method is continuous, in other words, filter switching only takes place with minimized jerks and accelerations. As a result, excessive wear and stresses on the drive means are avoided. The inventive method allows switching of desired value filters having any running times and has a wide application spectrum.

The individual steps of the inventive method are also carried out for a second machine axis. For the second machine axis, the output signals at different desired value filters are likewise checked for a deviation and switching between the desired value filters is enabled if the deviation falls below a threshold value. Separation of the first desired value filter of the first and second machine axes and the corresponding connection of the second desired value filter to the drive means of the first and second machine axes is carried out if the two deviations simultaneously fall below their respective threshold value in both machine axes. As a result, switching between the first and second desired value filters takes place essentially simultaneously in the two machine axes.

Simultaneous switching of the desired value filters at two machine axes allows the switching process to be carried out in the case of a movement of the machine which is caused by the overlapping of the two machine axes, for example a diagonal movement of a tool. With staggered filter switching of the first and second machine axes, there is the risk of a deviation in the position of the machine occurring between the two switching processes. This is detrimental to the attainable manufacturing precision, for example when switching from an auxiliary process time movement to a machining movement. Furthermore, these kinds of deviations in position can add up and can significantly reduce the attainable manufacturing precision with a long running time of a manufacturing program. The inventive method ensures essentially simultaneous filter switching in a plurality of machine axes and therefore counteracts the risk of a loss of precision even with long manufacturing programs. The attainable operation precision of the machine is increased thereby, and the technical potential thereof is further utilized. The inventive method can similarly also be transferred to three or more machine axes.

In a preferred embodiment of the invention, the first desired value filter is separated from the drive means and the second desired value filter is connected to the drive means during a movement along the first machine axis. The prerequisite for separation and connection is that the output signals to the desired value filters at least temporarily run simultaneously. Switching of the desired value filters during a movement along the first machine axis avoids machine downtimes and increases its efficiency. Consequently, the inventive method allows the technical possibilities of the machine to be utilized further.

At least one delay element can preferably also be arranged in the machine control system in the inventive method, which element decelerates the passage of the input signal or the output signal through the respective filter line. The delay element behaves neutrally in relation to the content of the input signal and output signal and has its dead time as the single parameter. The delay element is preferably designed in terms of software and can thereby be adjusted by the machine control system, so the dead time of the delay element can be adjusted. The total of the dead time of the delay element and the running time of the associated desired value filter form the total running time of a filter line. The delay element allows the total running time of the first filter line with the first desired value filter to be adapted to the total running time of the second filter line. This ensures that when the deviation of the output signals from each other is being determined, sections of the output signals that always correspond with each other are compared. For example, the beginning of a signal of the first output signal and the beginning of a signal of the second output signal are always subtracted from one another. A state suitable for switching the desired value filter is quickly and reliably identified thereby. Suitable states that are present for only a short time can also be used thereby for filter switching. The inventive method therefore has increased capacity.

In a particularly preferred embodiment of the inventive method, the dead time of the at least one delay element corresponds to a non-integral multiple of a clock length of the input signal. Consequently, the total dead time of a filter line can be increased to any degree. The inventive method can therefore be easily adapted to a large number of applications.

The length of the dead time of the at least one delay element can preferably correspond to the difference in the dead times of the first and second desired value filters. A dead time of this kind allows the total running time of a filter line to only be increased until the total running time of a parallel filter line is reached. Consequently, the total running times of all filter lines remain minimal in the inventive method. As a result, the claimed method requires a signal buffer with reduced capacity. The filter switching method can also be easily retrofitted in machine control systems with low computing capacity.

Furthermore, the input signal in the claimed method can comprise a position desired value, a speed desired value, an acceleration desired value, and/or a jerk desired value for the drive means. When determining the deviation in the output signals, optionally differences in terms of desired position, speed, acceleration, jerk or a combination of a plurality of these variables can therefore be calculated. Depending on the application, a particular one of these variables can most expediently characterize a state in which smooth filter switching is possible. For example, the speed desired value for filter switching from an auxiliary process time to a precise machining movement provides particularly precise information about whether a suitable state exists. Furthermore, by way of a combination of a plurality of said desired values any adjusted criterion can be chosen, which is most significant for the respective application.

In a particularly preferred embodiment of the invention, only the deviation of the position desired values in the output signals is determined when determining the deviation in the output signals. Position desired values exist directly in the machine control system. Speed, acceleration and jerk desired values are derived variables, which should be determined by additional components in the machine control system. In a large number of machine control systems, position desired values are the desired values, which are provided directly by a high-order control instance on the basis of a part program and/or an auxiliary process time control system. Surprisingly, the use of the position desired value alone already ensures a sufficiently smooth transition between the desired value filters for many applications. The inventive method can therefore also be efficiently implemented in machine control systems with low computing capacity. The claimed method is capable of being implemented as part of a retrofitting package.

The adjustable dead time of the delay elements in the second machine axis is particularly preferably adapted in the inventive method by way of addition in such a way that the output signals of the two machine axes are output essentially simultaneously. Mutually corresponding output signals are simultaneously compared thereby in the subtraction units and comparators in the case of the two machine axes. As a result, the inventive method, with minimal delay, allows the presence of a state to be detected, which is suitable for smooth filter switching. Consequently, suitable states that exist only briefly can also be used, so the flexibility of a machine control system in filter switching is increased.

In a further preferred embodiment of the invention at least one of the desired value filters is designed as a mean value former. Mean value formers are simple, and consequently fast, desired value filters, which are suitable for reliably smoothing an abrupt, step-like input signal to a continuous output signal. Mean value formers are also robust against sharply increasing or decreasing input signals and increase the complexity of a regulating system to only a minimal extent. Furthermore, mean value formers have a linear phase and the group running time is frequency independent. The efficiency of the inventive method is increased further by the use of a mean value former as the desired value filter.

A movement to be executed in the future along at least one machine axis can also preferably be calculated in advance or anticipated in the inventive method by means of a look ahead function. In detail, the input signal required for this is identified and evaluated. The anticipated input signal is evaluated when it is expected that a state of the machine control system suitable for filter switching exists. The suitable state for filter switching exists if the determined deviation of the output signals falls below the threshold value. This state can be anticipated if, over a minimum period, a movement of the machine axis is brought about at essentially constant speed by the input signal.

As a result, during the course of a manufacturing process the inventive method enables the optimum instant for filter switching to be identified. For example, when switching from a machining movement to an auxiliary process time movement, optimally early filter switching is desired. Furthermore, when switching from an auxiliary process time movement to a machining movement, optimally late filter switching is desired. The inventive method therefore allows the optimization potential in terms of filter switching to be depicted exactly when planning a manufacturing program. Optimization of a manufacturing program with machining movements and auxiliary process time movements is thereby facilitated.

The underlying object is also achieved by the inventive program. The claimed program is designed to be saved and executed in a control unit of a machine control system. The program is capable of issuing commands to at least one drive means of an associated machine. The claimed program is also designed to carry out at least one embodiment of the inventive method and implement it on the machine. The inventive program allows the technical potential of a machine to be utilized to a greater extent, a manufacturing process to be accelerated and requires low computing power. The program can thereby be played on an existing machine control system during the course of simple and cost-efficient retrofitting.

The object is also achieved by a control unit, which has a storage device and an arithmetic unit. The storage device and the arithmetic unit are capable of saving and executing the inventive program. The object underlying the invention is equally achieved by a machine, which has a tool and a drive means and is fitted with an inventive control unit.

BRIEF DESCRIPTION OF THE DRAWING

The present invention will be illustrated in more detail below with reference to figures of individual embodiments. The individual features of the illustrated embodiments can also be combined with each other within the framework of expert knowledge. In detail in the drawings.

DETAILED DESCRIPTION OF PREFERRED EMBODIMENTS

Figure 1:
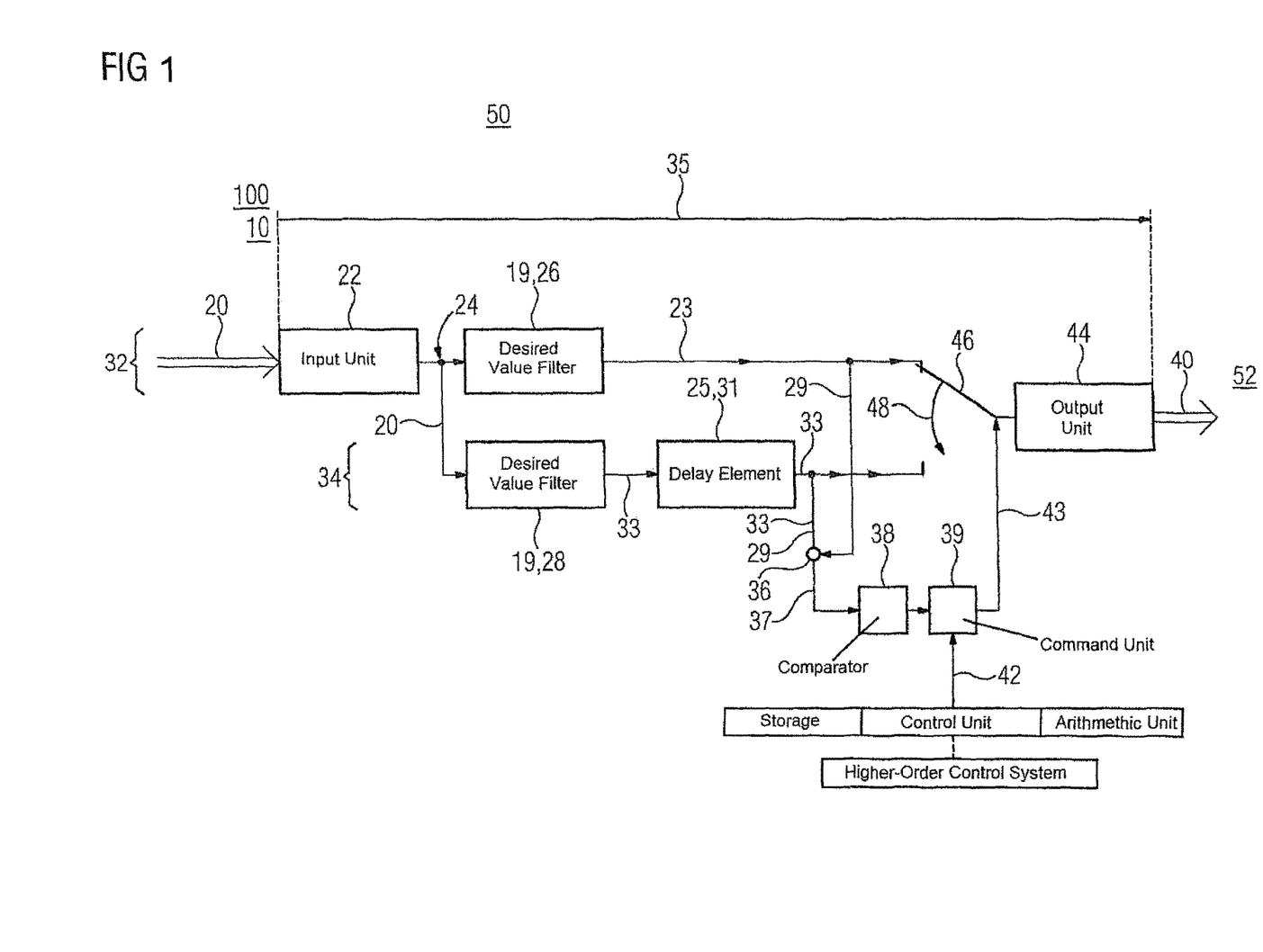
FIG. 1 schematically shows a construction of a regulating system for carrying out a first embodiment of the claimed method.

FIG. 1 shows a regulating system, which is configured for carrying out a first embodiment of the inventive method 100 in a machine control system 50. An input signal 20 is provided therein for a first machine axis 10, which signal enters the claimed method 100 at an input unit 22. Starting from the input unit 22, a signal passage 35 occurs in the direction of an output unit 44, which outputs an output signal 40 to a drive means 52 (not shown). Starting from the input unit 22, a duplication 24 of the input signal 20 occurs, so first and second desired value filters 26, 28 are supplied with the same input signal 20. The first desired value filter 26 is arranged in a first filter line 32 and the second desired value filter 28 is arranged in a parallel, second filter line 34. The two desired value filters 26, 28 each have a different running time 19. The first desired value filter 26 generates a first output signal 23 from the input signal 20. At the same time, the second desired value filter 28 generates a second output signal 33 from the input signal 20, and this is forwarded to a delay element 31. The delay element 31 has an adjustable dead time 25 and behaves neutrally in relation to the second output signal 33. The second output signal 33 is forwarded via a signal branch 29 to a subtraction unit 36. The first output signal 23 from the desired value filter is also forwarded via a signal branch 29 to the subtraction unit. The subtraction unit 36 forms the difference 37 between the first and second output signals 23, 33 and forwards the difference 37 to a comparator 38. The comparator 38 is designed to recognize whether the difference 37 falls below an adjustable threshold value. The presence of a difference 37, which is lower than the adjustable threshold value, is forwarded to a command unit 39. The command unit 39 is designed to receive a switching command 42 from a higher-order control system and outputs a switching command 43 if the comparator 38 simultaneously signals a difference 37 in the output signals 23, 33 below the threshold value. The switching command 43 brings about a switching process 48 of a switching means 46. The switching means 46 determines by way of its switching state which of the two desired value filters 26, 28 is connected to the output unit 44.

In the embodiment according to FIG. 1, the total of the running time 19 and the dead time 25 of the second desired value filter 28 or the delay element 31 essentially matches the running time 19 of the first desired value filter 26. Consequently, always corresponding, in other words, synchronous, output signals 23, 33 are present at the subtraction unit 36. States, in which a switching process 48 can be carried out smoothly, are consequently identified with a minimized delay. As a result, for switching the desired value filters 26, 28, states can also be used, which are only briefly suitable for smoothing filter switching.

Figure 2:
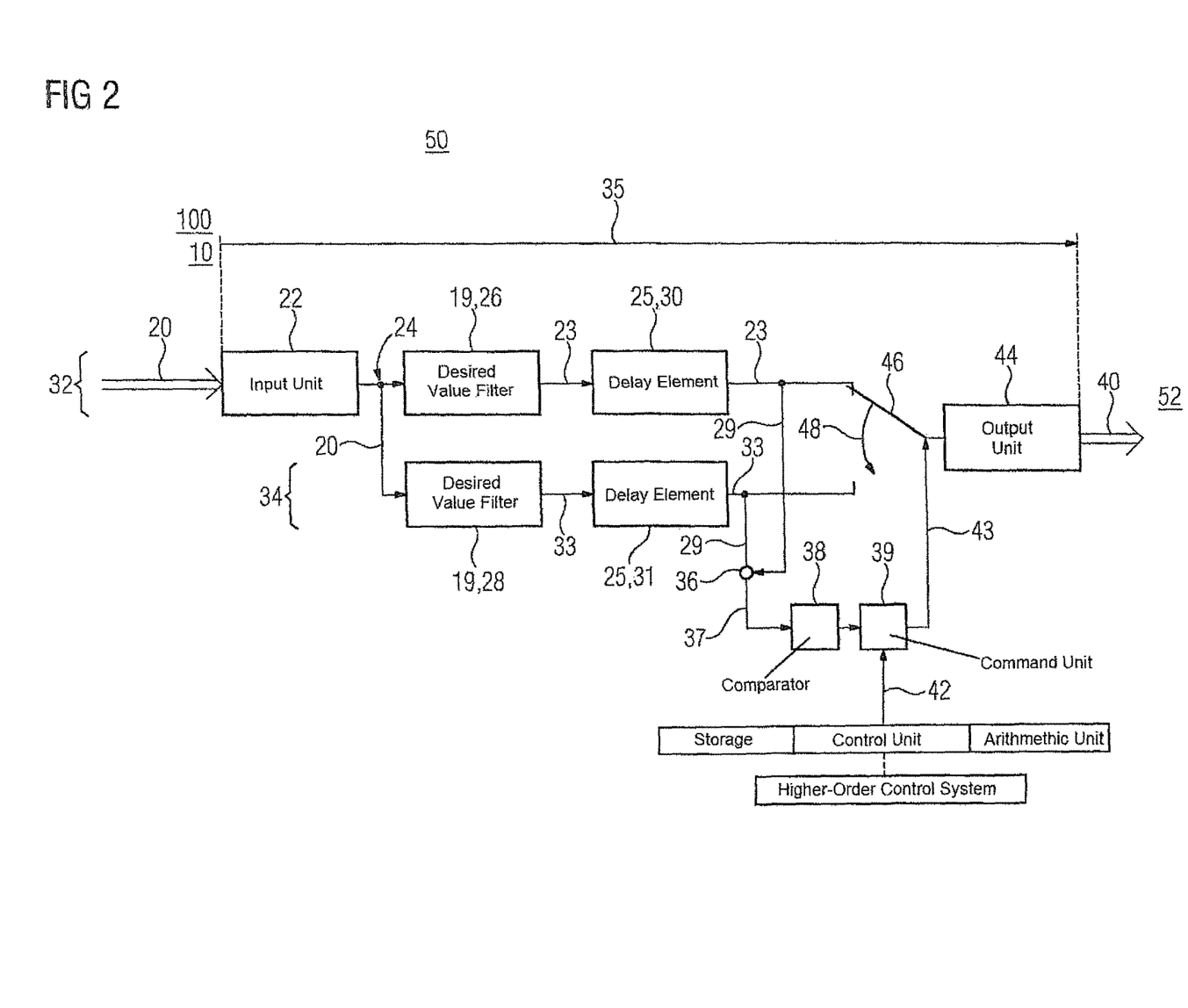
FIG. 2 schematically shows a construction of a regulating system for carrying out a second embodiment of the claimed method.

FIG. 2 shows a regulating system, which is designed for carrying out a second embodiment of the inventive method 100 in a machine control system 50. An input signal 20 is provided therein for a first machine axis 10, which signal enters the claimed method 100 at an input unit 22. Starting from the input unit 22, a signal passage 35 occurs in the direction of an output unit 44, which outputs an output signal 40 to a drive means 52 (not shown). Starting from the input unit 22, a duplication 24 of the input signal 20 takes place, so first and second desired value filters 26, 28 are supplied with the same input signal 20. The first desired value filter 26 is arranged in a first filter line 32 and the second desired value filter 28 is arranged in a parallel, second filter line 34. The two desired value filters 26, 28 each have a different running time 19. From the input signal 20, the first desired value filter 26 generates a first output signal 23, which is forwarded to a second delay element 31. At the same time, the second desired value filter 28 generates a second output signal 33 from the input signal 20, and this is forwarded to a second delay element 31. The delay elements 30, 31 each have an adjustable dead time 25 and behave neutrally in relation to the first and second output signals respectively. The second output signal 33 is forwarded along the signal path 35, after the second delay element 31, via a signal branch 29 to a subtraction unit 36. The first output signal 23 is also forwarded, after the first delay element 30, via a signal branch 29 to the subtraction unit 36. The subtraction unit 36 forms the difference 37 between the first and second output signals 23, 33 and forwards the difference 37 to a comparator 38. The comparator 38 is designed to recognize whether the difference 37 falls below an adjustable threshold value. The presence of a difference 37, which is lower than the adjustable threshold value, is forwarded to a command unit 39. The command unit 39 is designed to receive a switching command 42 from a higher-order control system and outputs a switching command 43 if a difference 37 in the output signals 23, 33 below the threshold value is simultaneously signalled by the comparator 38. The switching command 48 brings about a switching process 48 of a switching means 46. The switching means 46 determines by way of its switching state which of the two desired value filters 26, 28 is connected to the output unit 44.

In the embodiment according to FIG. 2, the total of the running time 19 and the dead time 25 of the second desired value filter 28 or delay element 31 essentially matches the running time 19 of the first desired value filter 26 combined with the dead time 25 of the first delay element 30. Consequently, always corresponding, in other words synchronous, output signals 23, 33 are present at the subtraction unit 36. As a result, states, in which a switching process 48 can be carried out smoothly, are identified with a minimal delay. As a result, states, which are only briefly suitable for smooth filter switching, can also be used for switching the desired value filters 26, 28.

Figure 3:
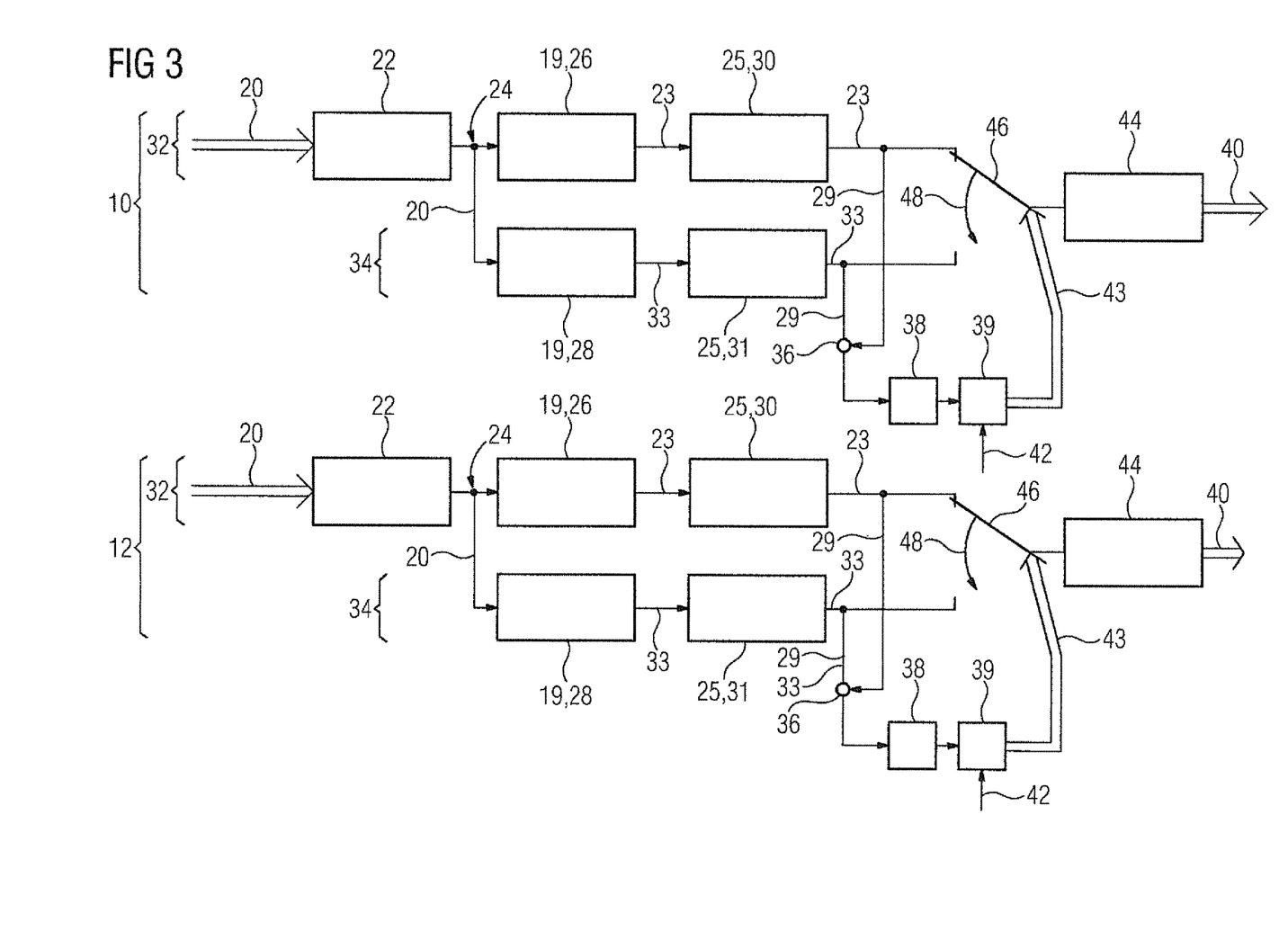
FIG. 3 schematically shows a construction of a regulating system for carrying out a third embodiment of the claimed method.

FIG. 3 schematically shows a third embodiment of the inventive method 100 in which a switching process 48 of desired value filters 26, 28 for a first machine axis 10 and a second machine axis 12 respectively is carried out. An input signal 20 is provided at the first and second machine axes 10, 12 respectively, which signal enters the claimed method 100 at an input unit 22. In relation to the two machine lines 10, 12, the input signals 20 are independent of each other. Starting from the input unit 22, a signal passage 35 takes place in the direction of an output unit 44, which outputs an output signal 40 to a drive means 52 (not shown). Starting from the input unit 22, a duplication 24 of the input signal 20 takes place, so first and second desired value filters 26, 28 are supplied with the same input signal 20. The first desired value filter 26 is arranged in a first filter line 32 and the second desired value filter 28 is arranged in a parallel, second filter line 34. The two desired value filters 26, 28 each have a different running time 19. From the input signal 20, the first desired value filter 26 generates a first output signal 23, which is forwarded to a first delay element 30. At the same time, the second desired value filter 28 generates a second output signal 33 from the input signal 20, and this is forwarded to a second delay element 31. The delay elements 30, 31 each have an adjustable dead time 25 and behave neutrally in relation to the first and second output signals 23, 33 respectively. The second output signal 33 is forwarded along the signal path 35, after the second delay element 31, via a signal branch 29 to a subtraction unit 36. The first output signal 23 is also forwarded, after the first delay element 30, via a signal branch 29 to the subtraction unit 36. The subtraction unit 36 forms the difference 37 between the first and second output signals 23, 33 and forwards the difference 37 to a comparator 38. The comparator 38 is designed to recognize whether the difference 37 falls below an adjustable threshold value. The presence of a difference 37, which is lower than the adjustable threshold value, is forwarded to the command unit 39. The command units 39 are each designed to receive a switching command 42 from a high-order control system and each output a switching command 43 if the associated comparator 38 in each case simultaneously signals differences 37 in the output signals 23, 33 below the respective threshold values for each machine axis 10, 12. Separate switching processes 48 of switching means 46 are brought about by the switching commands 43. Each switching means 46 determines by way of its switching state which of the two desired value filters 26, 28 is connected to the corresponding output unit 44.

In the embodiment in FIG. 3, the dead times 25 in the delay elements 30, 31 of the first and second machine axes 10, 12 are chosen in such a way that the in each case combined running times 19 and dead times 25 of the filter lines 32, 34 in the two machine axes 10, 12 are essentially identical. Consequently, always mutually corresponding, in other words essentially synchronous, output signals 23, 33 are present at the subtraction units 36 in the first and second machine axes 10, 12 despite independent input signals 20. As a result, smooth filter switching is simultaneously achieved for the two machine axes 10, 12.

Figure 4:
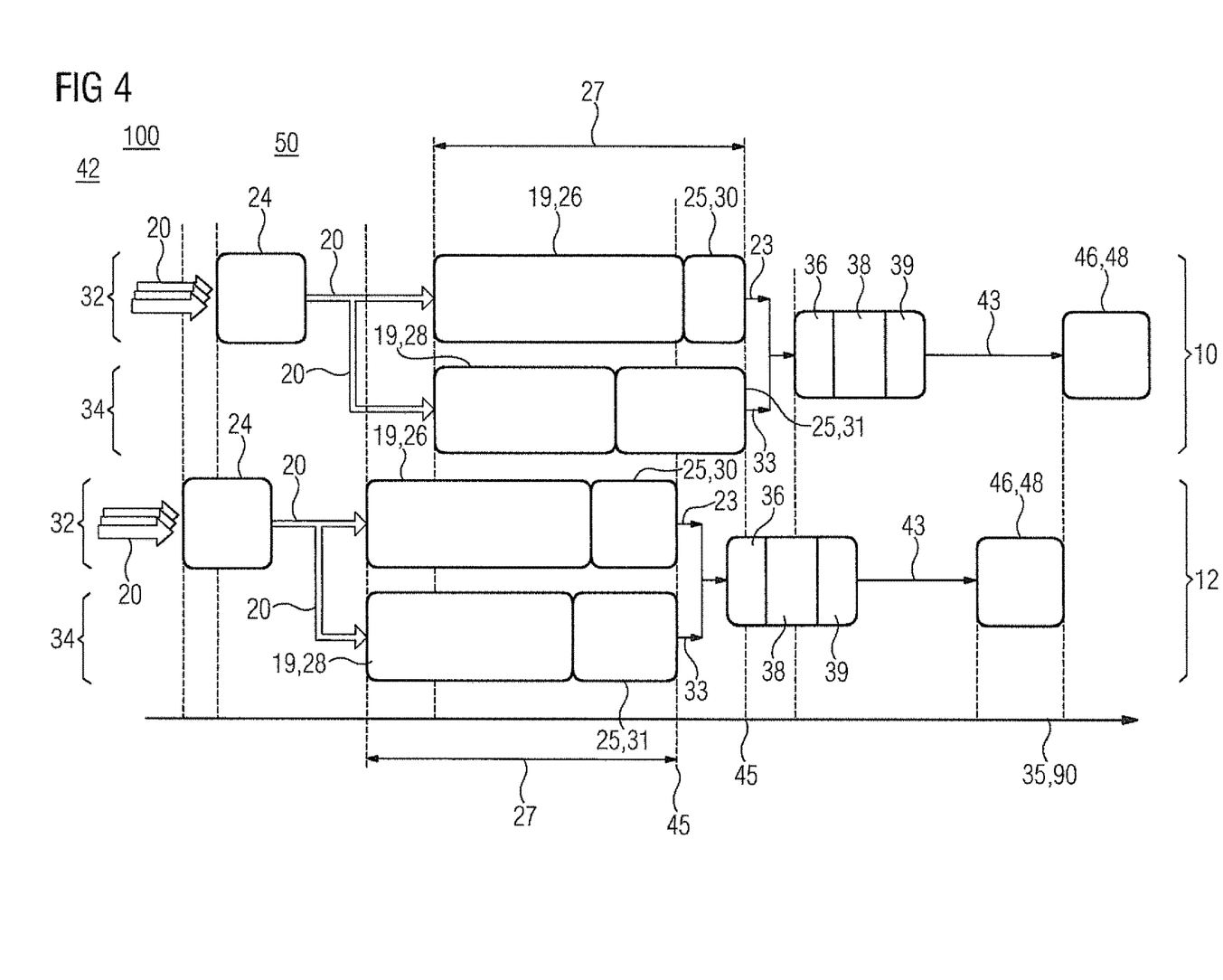
FIG. 4 shows a flowchart according to the third embodiment of the claimed method.

FIG. 4 shows a flowchart of a fourth embodiment of the inventive method 100. The chart shows a time axis 90 along which the signal passage 35 takes place. The broken vertical lines depict simultaneously occurring events on the time axis 90. In FIG. 4 there is a control input 42 of a higher-order control system (not shown), according to which filter switching is to be carried out for two machine axes 10, 12. Two input signals 20 arrive at different instants and after a duplication 24 in the case of each of the machine axes 10, 12 are guided in two separate filter lines 32, 34 each with a desired value filter 26, 28. The input signals 20 comprise position desired values, speed desired values, and acceleration desired values, which are indicated in FIG. 4 by a plurality of arrows. Different running times 19 exist for the individual filter lines 32, 34 of the two machine axes 10, 12 for each desired value filter 26, 28. The duration of a running time 19 is depicted by the dimensions of the areas associated with the desired value filters 26, 28. A delay element 30, 31 is associated with each of the desired value filters 26, 28 in the machine axes 10, 12, which element in turn has its own adjustable dead time 25 in each case. The signal passage 35 of the output signals 23, 33 is delayed in each filter line 32, 34 by the total of the running time 19 and the dead time 25 of the associated desired value filter 26, 28 or its delay element 30, 31. The adjustable dead times 25 of the delay elements 30, 31 are chosen in such a way that for the filter lines 32, 34 of one machine axis 10, 12 respectively, an essentially identical total running time 27 results.

The output signals 31, 32 are forwarded in the machine axes 10, 12 at different output instants 45 their associated subtraction units 36 and therewith also the respective comparators 38 and command units 39. A state, which is suitable for a switching process 48, exists in FIG. 4 for each individual machine axis 10, 12, so a separate switching command 43 is given for the two machine axes 10, 12 in order to actuate the switching means 46. The switching commands 43 are implemented in a staggered manner.

Figure 5:
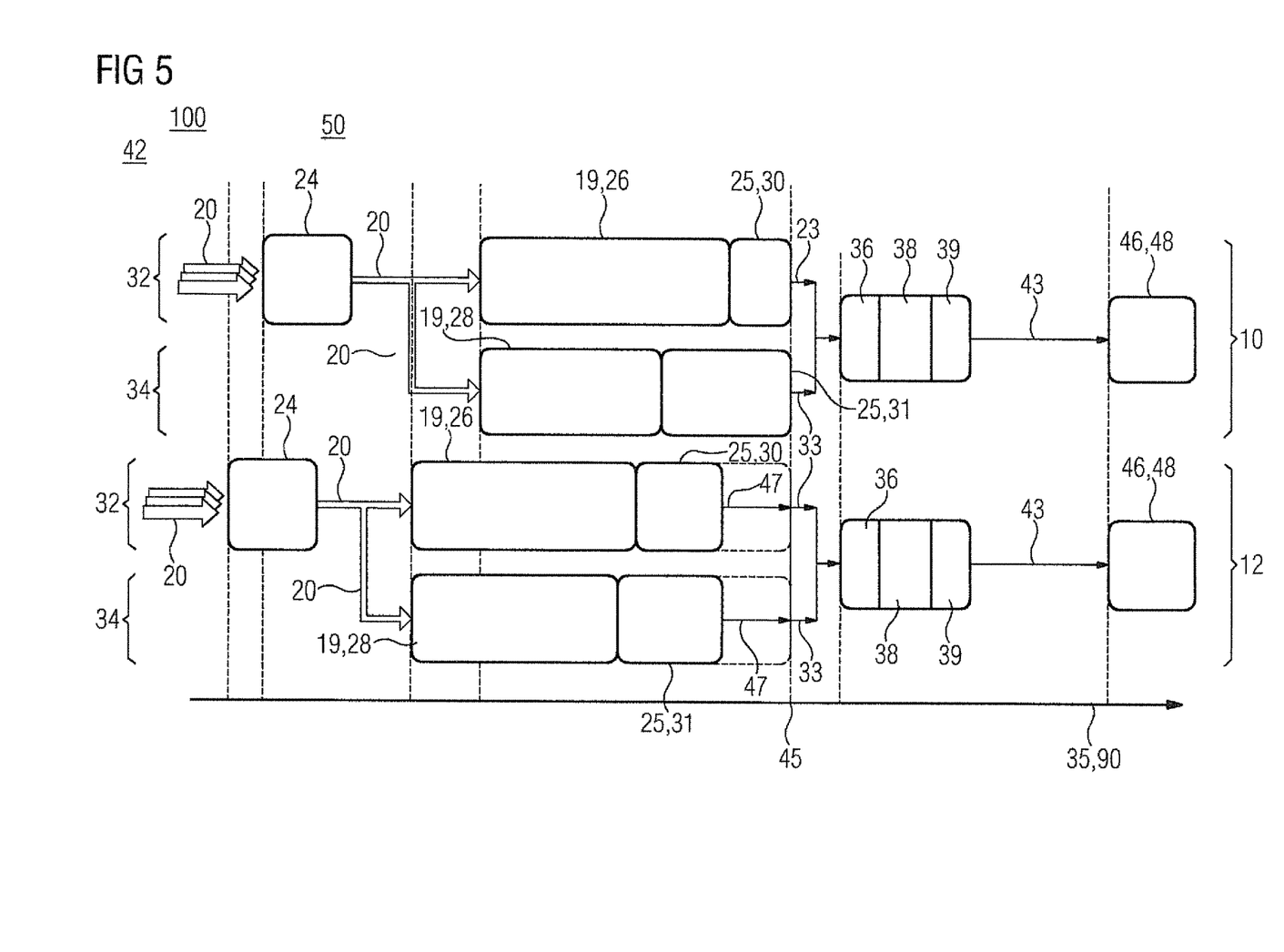
FIG. 5 shows a flowchart of a fourth embodiment of the claimed method.

FIG. 5 shows a further embodiment of the inventive method 100. This figure shows a flowchart of a fifth embodiment of the inventive method 100. The chart shows a time axis 90, along which the signal passage 35 takes place. The broken vertical lines depict simultaneously occurring events on the time axis 90. In FIG. 4 there is a control input 42 of a higher-order control system (not shown), according to which filter switching is to be carried out for two machine axes 10, 12. Two input signals 20 arrive at different instants and after a duplication 24 in the case of each of the machine axes 10, 12 are guided in two separate filter lines 32, 34 each with a desired value filter 26, 28. The input signals 20 comprise position desired values, speed desired values, and acceleration desired values, which are indicated in FIG. 4 by a plurality of arrows. Different running times 19 exist for the individual filter lines 32, 34 of the two machine axes 10, 12 for each desired value filter 26, 28. The duration of a running time 19 is depicted by the dimensions of the areas associated with the desired value filters 26, 28. A delay element 30, 31 is associated with each of the desired value filters 26, 28 in the machine axes 10, 12, which element in turn has its own adjustable dead time 25 in each case. The signal passage 35 of the output signals 23, 33 is delayed in each filter line 32, 34 by the total of the running time 19 and the dead time 25 of the associated desired value filter 26, 28 or its delay element 30, 31. The adjustable dead times 25 of the delay elements 30, 31 are firstly chosen in the two machine axes 10, 12 in such a way that an essentially identical total running time 27 results for the filter lines 32, 34 of one machine axis 10, 12 respectively. In the case of the second machine axis 12, the duration of the dead times 25 of the first and second delay elements 30, 31 is then increased by an adjustment 47. The extension 47 of the dead times 25 is designed in such a way that the output signals 23, 33 of the first and second machine axes 10, 12 are forwarded to the respective subtraction units 36 at the same output instant 45.

The output signals 31, 33 are forwarded in the machine axes 10, 12 at different output instants 45 their associated subtraction units 36, and therewith also the respective comparators 38 and command units 39. A state suitable for the switching processes 48 exists in FIG. 4 for each individual machine axis 10, 12, so a separate switching command 43 is given for the two machine axes 10, 12 in order to actuate the switching means 46. The switching commands 43, and therewith the switching processes 48, are implemented simultaneously.

The invention claimed is:

1. A filter switching method for a control system of a machine, the machine having a first machine axis and a second machine axis, each of the first and second machine axes including a drive and first and second desired value filters, the method comprising the steps:
   for the first machine axis:
   a) applying an input signal to the first desired value filter to generate a first output signal supplied to the drive;
   b) applying the input signal to the second desired value filter to generate a second output signal supplied to the drive of the respective machine axis, wherein the first and second desired value filters for the respective machine axis have different running times;
   c) determining a deviation between the first output signal and the second output signal;
   d) when the respective deviation in step (c) falls below an adjustable threshold value, immediately disconnecting the respective first desired value filter from the drive of the respective machine axis and connecting the second desired value filter to the drive of the respective machine axis; and
   e) repeating steps a)-d) for the second machine axis,
   wherein the first desired value filter of the first machine axis is disconnected from the drive of the first machine axis and the second desired value filter of the first machine axis is connected to the drive of the first machine axis at a time the first desired value filter of the second machine axis is disconnected from the drive of the second machine axis and the second desired value filter of the second machine axis is connected to the drive of the second machine axis, and
   wherein the first desired value filter and the second desired value filter for the drive of the first and second machine axes are connected and disconnected, respectively, when the deviations for both machine axes simultaneously fall below their respective adjustable threshold value at a same time.

2. The filter switching method of claim 1, wherein at least step d) is carried out when there is a movement at the first machine axis.

3. The filter switching method of claim 1, wherein at least one of the first and second output signals is delayed by at least one delay element with an adjustable dead time.

4. The filter switching method of claim 3, wherein the adjustable dead time corresponds to a non-integral multiple of a clock length of the input signal.

5. The filter switching method of claim 3, wherein a duration of the adjustable dead time corresponds to a difference between running times of the first and second desired value filters.

6. The filter switching method of claim 1, wherein the input signal comprises at least one of a desired position value, a desired speed value, a desired acceleration value, and a desired jerk value for the drive.

7. The filter switching method of claim 6, wherein a deviation in the desired position values is determined from the deviation between the first and second output signals determined in step c).

8. The filter switching method of claim 6, wherein a transition between the speed desired values, the desired acceleration values, or the desired jerk values determined from a deviation between the first and second output signals in step d) is continuous.

9. The filter switching method of claim 6, wherein a transition between the speed desired values, the desired acceleration values, or the desired jerk values determined from a deviation between the first and second output signals in step d) is linear.

10. The filter switching method of claim 1, wherein at least one of the desired value filters is a mean value former.

11. The filter switching method of claim 1, further comprising identifying with a look ahead function a switching period, during which the input signal of at least one machine axis is capable of causing a movement along the at least one machine axis with an essentially constant speed.

12. A program comprising program instructions embodied on a non-transitory storage medium, wherein the program instructions, when read into a memory of a control unit of a machine having a first machine axis and a second machine axis, with each of the first and second machine axes including a drive and first and second desired value filters, cause the control unit to, for the first machine axis:

a) apply an input signal to the first desired value filter to generate a first output signal supplied to the drive of the respective machine axis;
b) apply the input signal to the second desired value filter to generate a second output signal supplied to the drive of the respective machine axis, wherein the first and second desired value filters for the respective machine axis have different running times;
c) determine a deviation between the first output signal and the second output signal;
d) when the respective deviation in step (c) falls below an adjustable threshold value, immediately disconnect the respective first desired value filter from the drive of the respective machine axis and connect the second desired value filter to the drive of the respective machine axis; and
e) repeat steps a)-d) for the second machine axis,
wherein the first desired value filter of the first machine axis is disconnected from the drive of the first machine axis and the second desired value filter of the first machine axis is connected to the drive of the first machine axis at a time the first desired value filter of the second machine axis is disconnected from the drive of the second machine axis and the second desired value filter of the second machine axis is connected to the drive of the second machine axis, and
wherein the first desired value filter and the second desired value filter for the drive of the first and second machine axes are connected and disconnected, respectively, when the deviations for both machine axes simultaneously fall below their respective adjustable threshold value at a same time.

13. A control unit for a machine, comprising a storage unit and an arithmetic unit configured to store and execute the program of claim 12.

14. A machine, comprising at least one tool and a first machine axis and a second machine axis, with each of the first and second machine axes including a drive and first and second desired value filters, wherein the machine has a control unit configured to, for the first machine axis:

a) apply an input signal to the first desired value filter to generate a first output signal supplied to the drive of the respective machine axis;
b) apply the input signal to the second desired value filter to generate a second output signal supplied to the drive of the respective machine axis, wherein the first and second desired value filters for the respective machine axis have different running times;
c) determine a deviation between the first output signal and the second output signal;
d) when the respective deviation in step (c) falls below an adjustable threshold value, immediately disconnect the respective first desired value filter from the drive of the respective machine axis and connect the second desired value filter to the drive of the respective machine axis; and
e) repeat steps a)-d) for the second machine axis,
wherein the first desired value filter of the first machine axis is disconnected from the drive of the first machine axis and the second desired value filter of the first machine axis is connected to the drive of the first machine axis at a time the first desired value filter of the second machine axis is disconnected from the drive of the second machine axis and the second desired value filter of the second machine axis is connected to the drive of the second machine axis, and
wherein the first desired value filter and the second desired value filter for the drive of the first and second machine axes are connected and disconnected, respectively, when the deviations for both machine axes simultaneously fall below their respective adjustable threshold value at a same time.

* * * * *